US006838868B1

(12) United States Patent
Bosy

(10) Patent No.: US 6,838,868 B1
(45) Date of Patent: Jan. 4, 2005

(54) TEST HEAD ACTUATION SYSTEM WITH POSITIONING AND COMPLIANT MODES

(75) Inventor: Brian J. Bosy, Framingham, MA (US)

(73) Assignee: Teradyne, Inc., Boston, MA (US)

( * ) Notice: Subject to any disclaimer, the term of this patent is extended or adjusted under 35 U.S.C. 154(b) by 415 days.

(21) Appl. No.: 09/707,764

(22) Filed: Nov. 7, 2000

(51) Int. Cl.[7] ............................................. G01R 19/00
(52) U.S. Cl. ................................................. 324/158.1
(58) Field of Search ................................ 324/758, 765, 324/158.1, 73.1; 73/866.5; 33/572

(56) References Cited

U.S. PATENT DOCUMENTS

| 5,828,223 A | * 10/1998 | Rabkin et al. ............... 324/754 |
| 5,949,002 A |   9/1999 | Alden ......................... 73/866.5 |
| 6,166,552 A | * 12/2000 | O'Connell .................. 324/754 |

* cited by examiner

Primary Examiner—Vinh P. Nguyen

(74) Attorney, Agent, or Firm—Bruce D. Rubenstein

(57) ABSTRACT

A system for positioning a test head for compliantly docking the test head with a prober, handler, or other peripheral for automatically testing electronic components. The system includes a plurality of backdrivable linear actuators. Each actuator has a first end mechanically coupled to the test head and a second end mechanically coupled to a support for holding the test head, for example, a manipulator. In a first mode, a control system applies inputs to the actuators for variably extending the actuators to establish a desired position of the test head relative to the support. The desired position is generally a centered position of the test head within a compliance range; however, it may also be a non-centered position that tends to align the test head with the peripheral. In a second mode, the control system stops varying the input to the actuator. The actuator tends to maintain its position, but complies with external forces applied to the test head. In the second mode, the actuators can be driven in compliance with external forces both forward and backward, and provide only slight resistance to movement in both directions. The disclosed system for positioning a test head is particularly useful for providing compliant docking with extremely heavy test heads.

23 Claims, 8 Drawing Sheets

TEST HEAD ACTUATION SYSTEM WITH POSITIONING AND COMPLIANT MODES

This invention relates generally to precisely positioning heavy objects, and more particularly to precisely positioning a test head of an electronic automatic test system for docking the test head with a prober, handler, or other peripheral for testing electronic devices.

BACKGROUND OF THE INVENTION

Manufacturers of semiconductor chips and assemblies use automatic test equipment ("ATE") to verify the performance of devices before the devices are shipped to customers. ATE systems typically include a "test head" and a "tester body." The test head houses portions of the test system that are preferably located as close as possible to the device under test, and connects to the tester body via one or more cables. For testing electronic devices, the test head connects or "docks" with a peripheral. The peripheral feeds a series of devices to the ATE system for testing, and the ATE system tests the devices.

Constraints affecting semiconductor test processes often make it impractical to move the peripheral to the test head. In most manufacturing facilities, therefore, the peripheral that feeds the chips remains stationary, and the test head is moved into position for docking with the peripheral.

A device called a "manipulator" moves the test head to the peripheral. FIG. 1 shows an example of a manipulator 100 for supporting a test head 110. A manipulator of this type is disclosed in U.S. patent application Ser. No. 09/615,292, entitled "AUTOMATIC TEST MANIPULATOR WITH SUPPORT INTERNAL TO TEST HEAD," which is hereby incorporated by reference. This manipulator is expected to be used with the Tiger™ test system, which is currently being developed by Teradyne, Inc., of Boston, Mass.

As shown in FIG. 1, a manipulator 100 supports a test head 110 from a region internal to the test head 110. The manipulator 100 rotates the test head upon a twist gear 114, and swings the test head at the end of a horizontal member 116 upon a swing bearing 122. The manipulator 100 raises and lowers the test head on linear bearings 124. A base 120 supports the manipulator 100, and preferably includes outriggers 126 to prevent the manipulator from tipping.

The manipulator 100 preferably includes actuators such as motors (not shown) on the twist gear 114, linear bearings 124, and swing bearing 122. The actuators move the test head to the peripheral, and orient the test head for docking. The test head is then docked with the peripheral by finely adjusting the position and orientation of the test head.

Manipulators commonly provide a range of "compliance" that allows a test head to be rotated about one or more axes as the test head and peripheral are being docked. The range is "compliant" because the test head literally complies with forces applied to the test head, which during docking tend to cause the mating surface of the test head to become coplanar with the mating surface of the peripheral. Without compliance, the manipulator would have to finely adjust the test head to a coplanar orientation with respect to the peripheral by precisely controlling the manipulator's actuators. For an example of a manipulator that automatically controls its actuators to achieve precise docking, see U.S. Pat. No. 5,949,002, entitled "Manipulator for Automatic Test Equipment with Active Compliance."

Near the peripheral, the test head must be moved with great care. Both the test head and the peripheral include fragile electronic assemblies that can be damaged by collisions between the test head and the peripheral. Generally, the test head includes alignment pins for entering alignment bushings within the peripheral. During docking, the alignment pins must be made to enter the alignment bushings without bending or breaking them.

FIG. 2 is an exploded view of the test head 110 of FIG. 1, which illustrates how compliant movement of the test head 110 used in the Tiger™ test system can be achieved. As shown in FIG. 2, the test head 110 is composed of two portions 110a and 110b, which fasten to either side of a C-shaped stiffener 112. A central blade 210 extends from the manipulator 100 into the C-shaped stiffener 112, where it is held in place by a spherical bearing 228. The spherical bearing 228 mechanically couples the central blade 210 to the test head 110 via a transition insert 224, and allows the test head 110 to be rotated with respect to the central blade 210. The transition insert 224 has a fixed position relative to the test head (although it can be moved back and forth on rails to center the test head by rotating the lead screw 226). The transition insert 224 has a clearance area that completely surrounds the central blade 210. The clearance area allows the test head 110 to be rotated over a limited angular range about the spherical bearing 228. More specifically, the test head 110 can be rotated over approximately 5 degrees in each of the conventional directions of theta, tumble, and twist. These directions are illustrated, respectively, with the arrows 230, 232, and 236.

It is generally desirable that a test head be oriented toward the center of its compliance range about each axis for which compliance is provided, during the time when the test head is moved into position for docking. Centering each axis of a test head within its compliance range ensures that the test head always has some range of rotation available for providing compliant docking.

In the past, manipulators have used springs to bias each axis toward the center of its compliance range. FIG. 3 illustrates this approach for spring-biasing a conventional fork-arm manipulator. Fork arms 316a and 316b of a manipulator support a test head 310. Within each of the fork arms, springs 320a and 320b bias a shaft 318 that holds the test head toward the center of a compliance range along the length of the fork arms.

When the manipulator roughly aligns the test head 310 and presses the test head against the peripheral, the springs 320a and 320b adjust (one compresses, the other expands) in compliance with the applied force to allow the mating surfaces of the test head and peripheral to come together. When the test head is undocked from the peripheral, the springs 320a and 320b restore the orientation of the test head 310 to the center of the compliance range.

In the Tiger™ test system, the need to provide compliant docking of the test head has given rise to new challenges. The Tiger™ test head is extremely heavy, weighing approximately 1,270 kilograms (2,800 lbs.). We have recognized that a slight misalignment of the center of gravity of the test head from the location of the spherical bearing induces a large turning moment of the test head. In addition, cables attached to the test head tend to shift position as the test head is moved and rotated, and thus tend to offset the balance of the test head. If the test head were biased in its compliance range with springs, the springs would need to be extremely stiff to resist the large turning moment of the test head and the offsetting forces from the cables. However, we have recognized that stiff springs cause movement of the test head to become stiff, and thus non-compliant. Another solution is needed to satisfy the demands of gentle, compliant docking.

SUMMARY OF THE INVENTION

With the foregoing background in mind, it is an object of the invention to compliantly dock a heavy test head with a peripheral, without being impaired by large turning moments or offsetting forces.

To achieve the foregoing object, as well as other objectives and advantages, a system for positioning a test head includes a plurality of linear actuators. Each actuator has a first end mechanically coupled to the test head and a second end mechanically coupled to a support for the test head, for example, a manipulator. In a first mode, a control system applies inputs to the actuators for variably controlling the extension of each actuator, and thus for controlling a desired position of the test head relative to the support. The desired position may be, for example, a centered position within a compliance range of the test head. It may also be a non-centered position, which tends to align the test head with the peripheral. In a second mode, the control system stops varying the input to the actuators. The actuators tend to maintain their extensions, but comply with external forces applied to the test head. The actuators can be driven in compliance with the external forces both forward and backward, and provide only slight resistance to movement in both directions.

BRIEF DESCRIPTION OF THE DRAWINGS

Additional objects, advantages, and novel features of the invention will become apparent from a consideration of the ensuing description and drawings, in which.

DESCRIPTION OF THE PREFERRED EMBODIMENT

Structure

Figure 1:
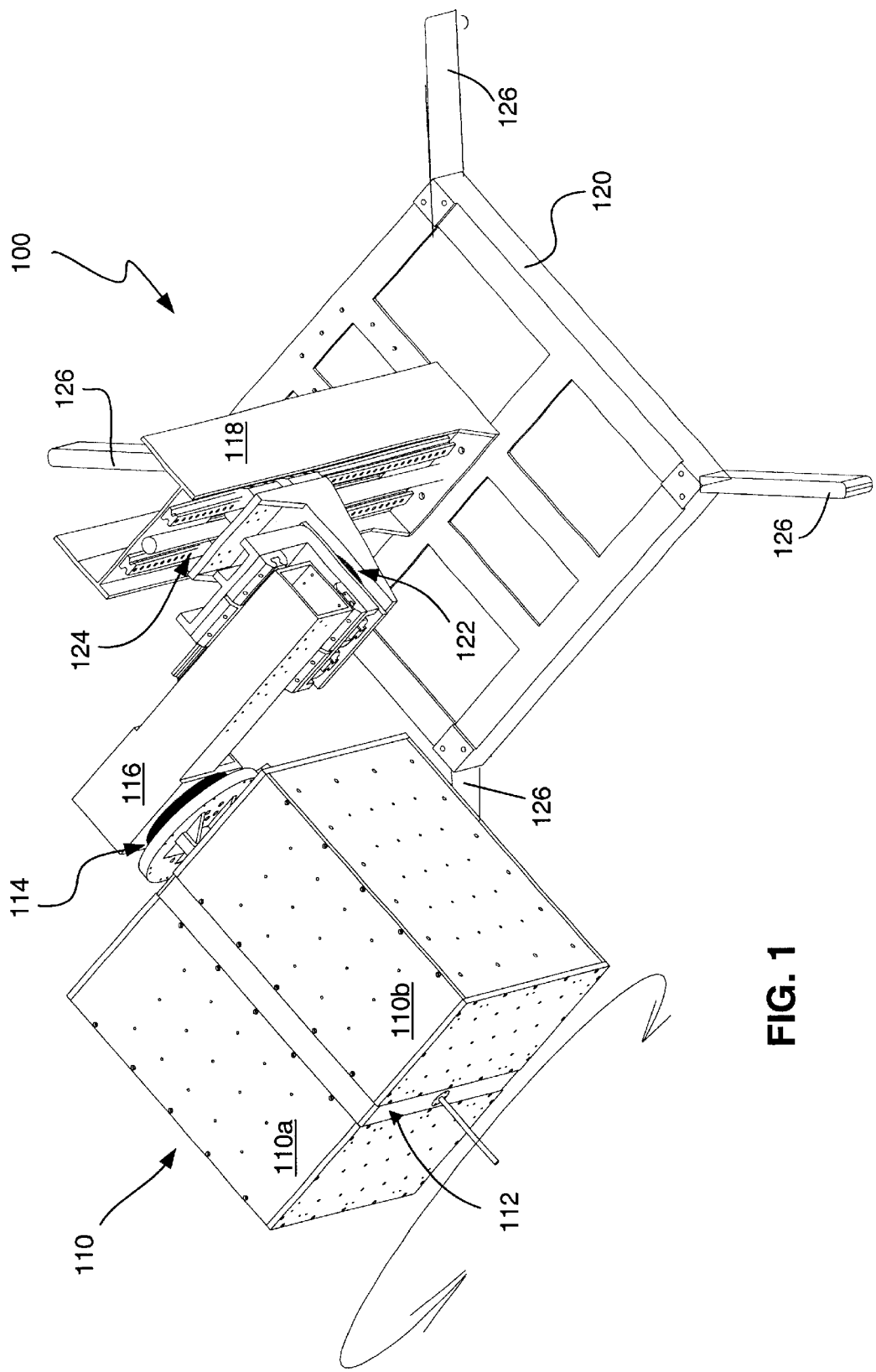
FIG. 1 is a perspective view of a manipulator for holding a test head using an internal gimbal, in accordance with the prior art.
Figure 2:
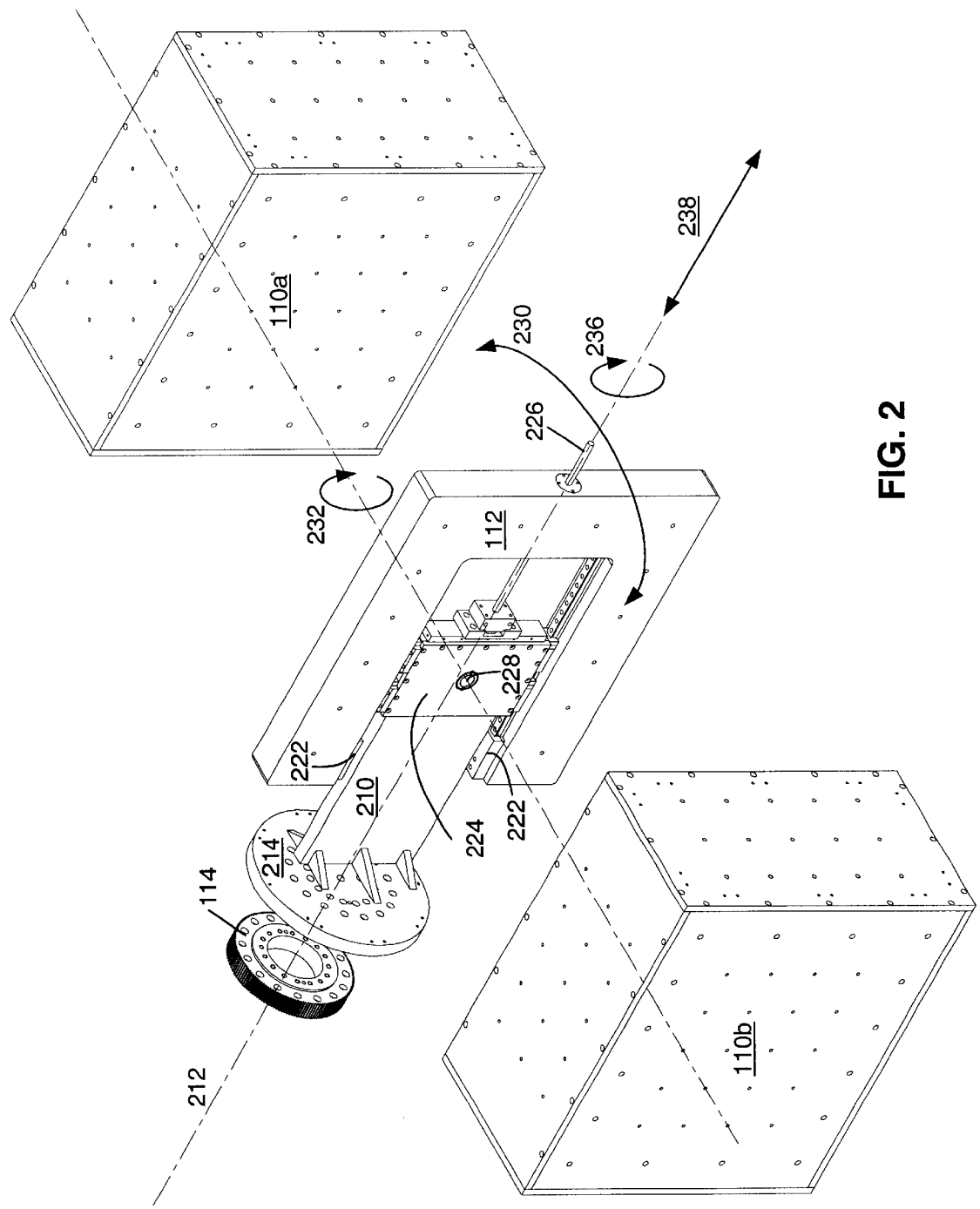
FIG. 2 is an exploded view of the test head 110 of FIG. 1.
Figure 3:
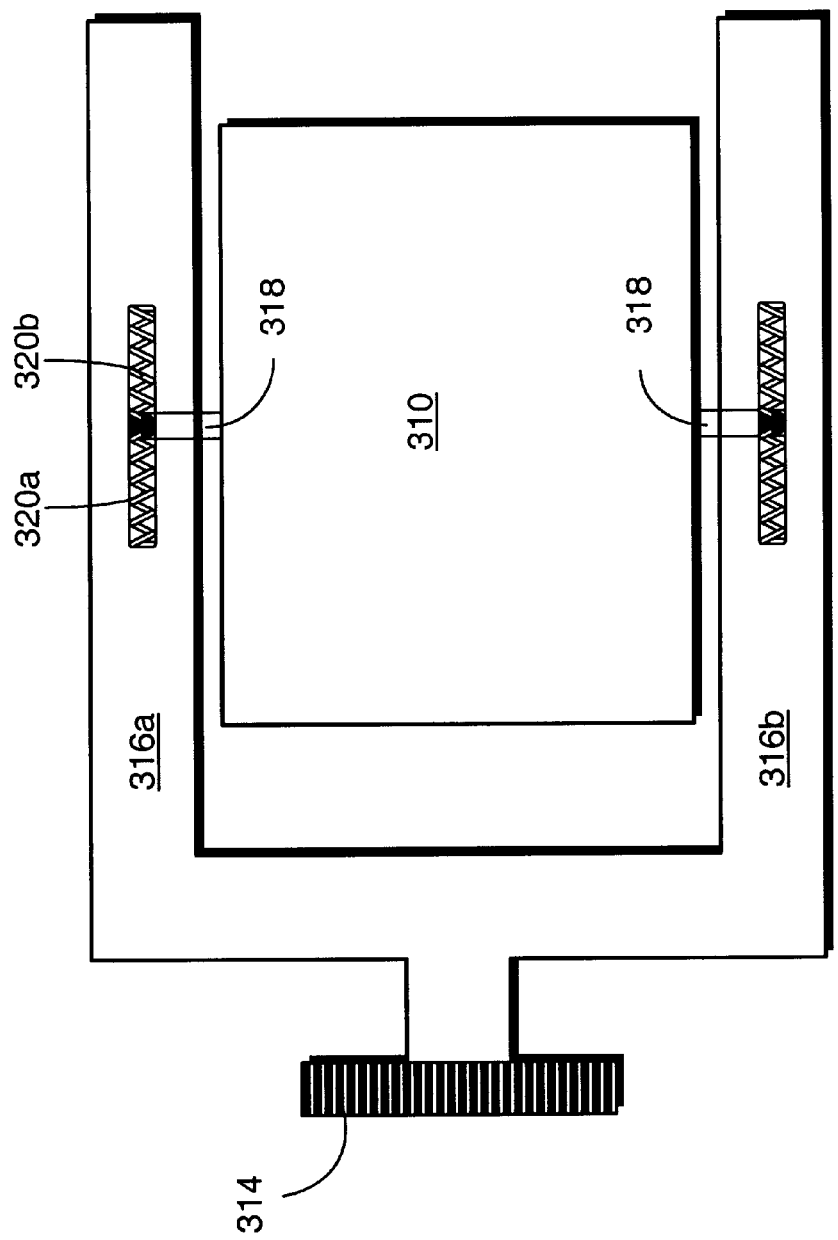
FIG. 3 is a simplified, schematic view of the fork arms of a conventional manipulator, which shows how compliance has been achieved in conventional manipulators using springs.
Figure 4:
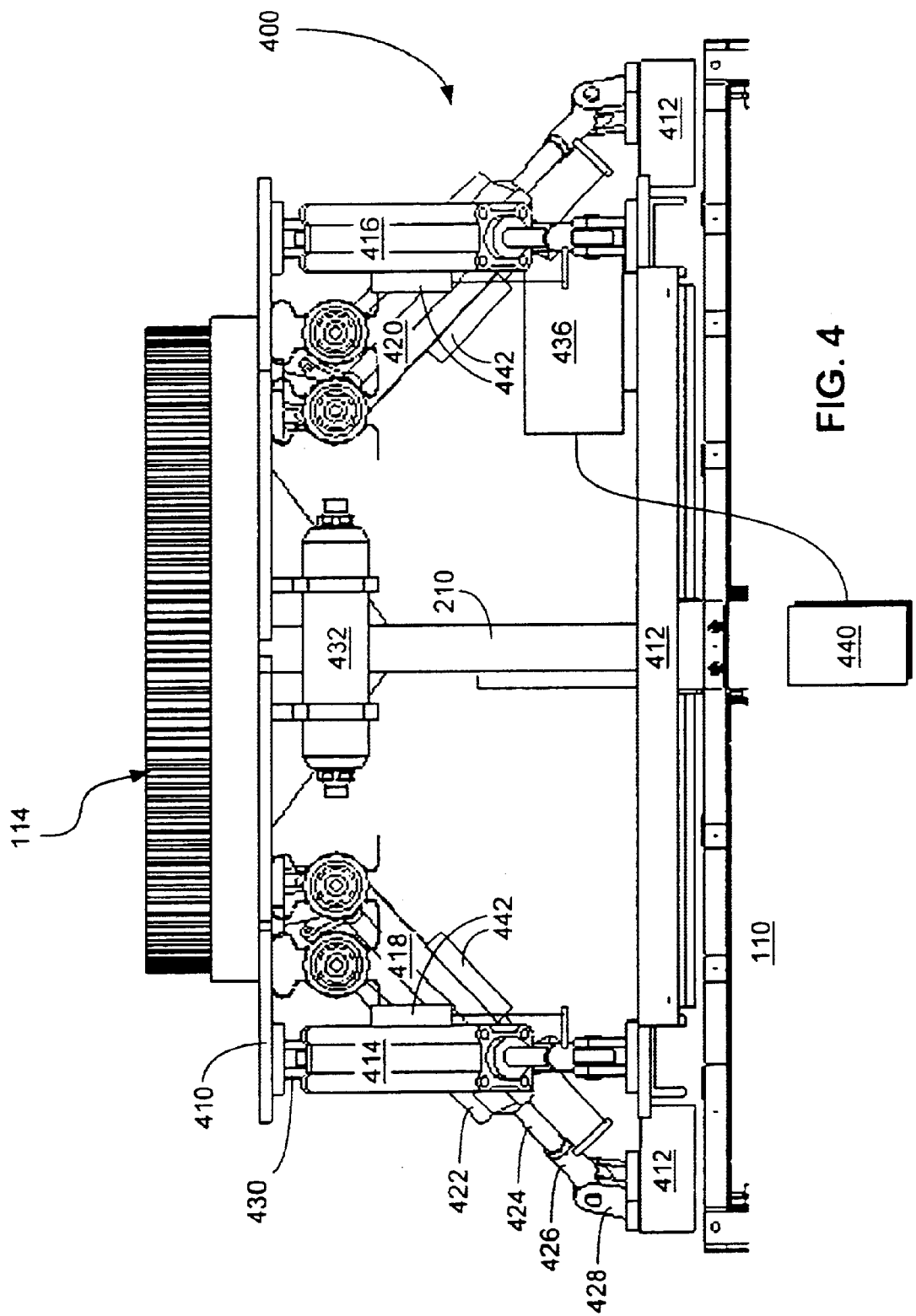
FIG. 4 is a top view of a test head actuation system according to the invention, as used with the manipulator and test head of FIGS. 1 and 2.
Figure 5:
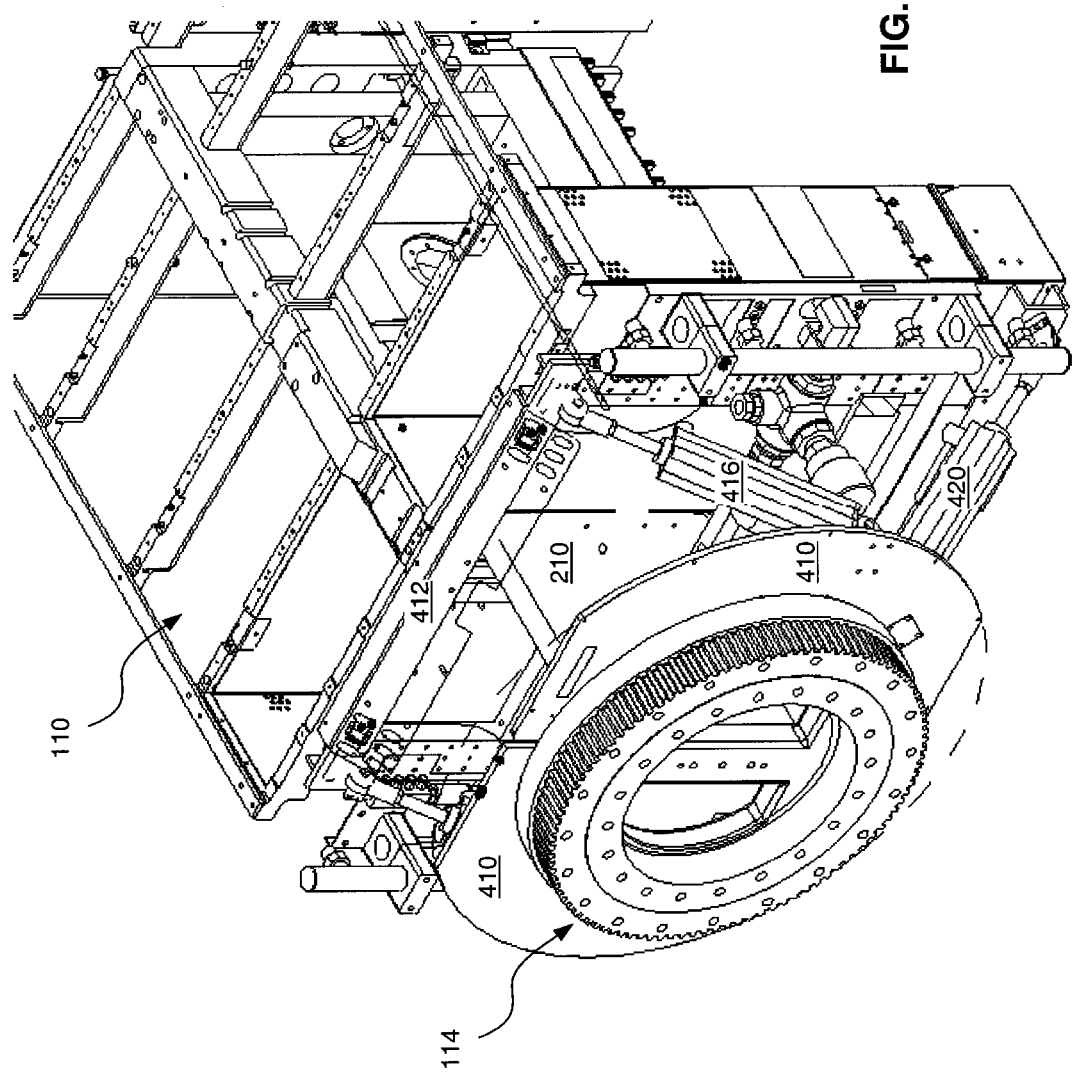
FIG. 5 is an isometric view of the test head actuation system of FIG. 4.
Figure 6:
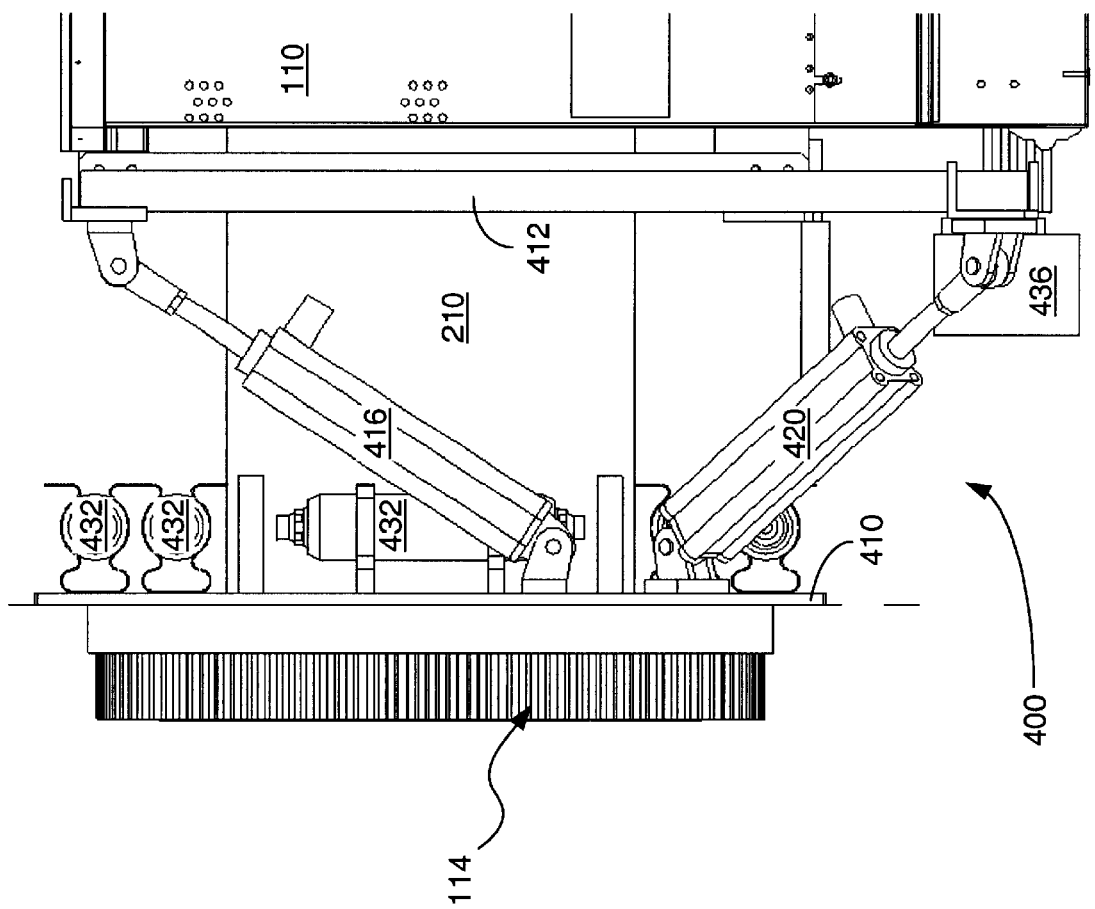
FIG. 6 is a side view of the test head actuation system of FIGS. 4 and 5.

FIGS. 4–7 illustrate from different perspectives an actuation system 400 for positioning a test head 110 according to the invention, as used with the internal gimbal manipulator 100 of FIGS. 1 and 2. Referring to the top view shown in FIG. 4, the actuation system 400 includes a plurality of linear actuators, for example, pneumatic cylinders 414, 416, 418, and 420. The pneumatic cylinders are mechanically coupled to a support plate 410 at respective first ends and to a cylinder mounting bracket 412 at respective second ends. The support plate 410 is fixedly mounted to the twist gear 114 of the manipulator 100, and the cylinder mounting bracket 412 is fixedly mounted to the test head 110. The central blade 210 extending from the manipulator 100 supports weight of the test head 110. Actuating the cylinders 414–420, for example by varying their pneumatic pressure, has the effect of changing the relative position of the test head 110 with respect to the manipulator 100, within the compliance range of the test head 110.

Each of the pneumatic cylinders 414–420 has a body 422 that is rotatably attached to the twist support plate 410 using, for example, a clevis 430 and a clevis pin. A shaft 424 extends a variable length from the body 422 of each cylinder, and is terminated in a tie rod 426. Each tie rod is rotatably attached to the cylinder mounting bracket 412 using a clevis 428 and clevis pin. Other types of mechanical connections that allow for rotational movement can also be used.

The pneumatic cylinders are commercially available from Festo AG & Company, of Esslingen, Germany, and have 40 mm bore and approximately 90 mm (3.5") stroke. The pneumatic cylinders 414–420 preferably have two pneumatic inputs each. Applying positive pressure at the first pneumatic input with respect to the second pneumatic input tends to extend the shaft 424 of the cylinder from the body 422. Applying positive pressure at the second pneumatic input with respect to the first pneumatic input tends to retract the shaft 424 into the body 422 of the cylinder. The pneumatic cylinders are preferably operated at approximately 80 p.s.i. Each cylinder preferably includes a brake (not shown) for locking the extension of the cylinder in a fixed position.

The inputs to each pneumatic cylinder are preferably driven from a source of compressed air or other fluid via a valve manifold 436. The valve manifold includes different segments for controllably applying pressure to each of the different pneumatic cylinders 414–420. Each segment can preferably assume at least three valve configurations. In the first configuration, the segment applies positive pressure to the first pneumatic input with respect to the second pneumatic input of the respective cylinder. This generally entails conducting compressed air to the first pneumatic input and conducting exhaust air to the second pneumatic input, and results in the shaft 424 extending further from the body 424 of the cylinder. In the second configuration, the connections to the first and second pneumatic inputs of the respective cylinder are reversed, so that the manifold pressurizes the second input with respect to the first input. In this mode, the shaft 424 tends to retract into the body 422 of the cylinder. In the third configuration, the valve manifold blocks pressure to both pneumatic inputs of the respective cylinder, so that the first and second pneumatic inputs are neither compressed nor exhausted. In this mode, the respective pneumatic cylinder maintains its previously established condition indefinitely.

By controllably applying pressure, the pneumatic cylinders 414–420 can be actuated to center the test head 110 within its compliance range, or to orient the test head at any desired angle within its compliance range. Once the desired orientation is established, the condition of the cylinders can be held constant by controlling the manifold to block pressure to the cylinders (i.e., the third mode).

With pressure blocked, the pneumatic cylinders act like air springs, their shafts extending and retracting in compliance with external forces applied to the test head. The pneumatic cylinders do not necessarily provide "soft" compliance, however, i.e., they can not necessarily be moved easily. Because they hold only a relatively small volume of air, the applied force required to extend or retract the cylinder shafts by a given amount is relatively high. The preferred embodiment addresses this problem through the use of pneumatic accumulators 432. In particular, a different pneumatic accumulator 432 is provided in series with each pneumatic input of each cylinder 414–420. As there are a total of four pneumatic cylinders 414–420, the actuation system 400 includes a total of eight pneumatic accumulators 432. Each accumulator 432 has the effect of increasing the volume of the respective portion (either extending or retracting) of each cylinder. With the volume increased, the force required to move each shaft is reduced in proportion to the volume of the accumulator. As the accumulators can be made arbitrarily large, the force required to achieve compliant motion of the test head can be made arbitrarily small.

Figure 7:
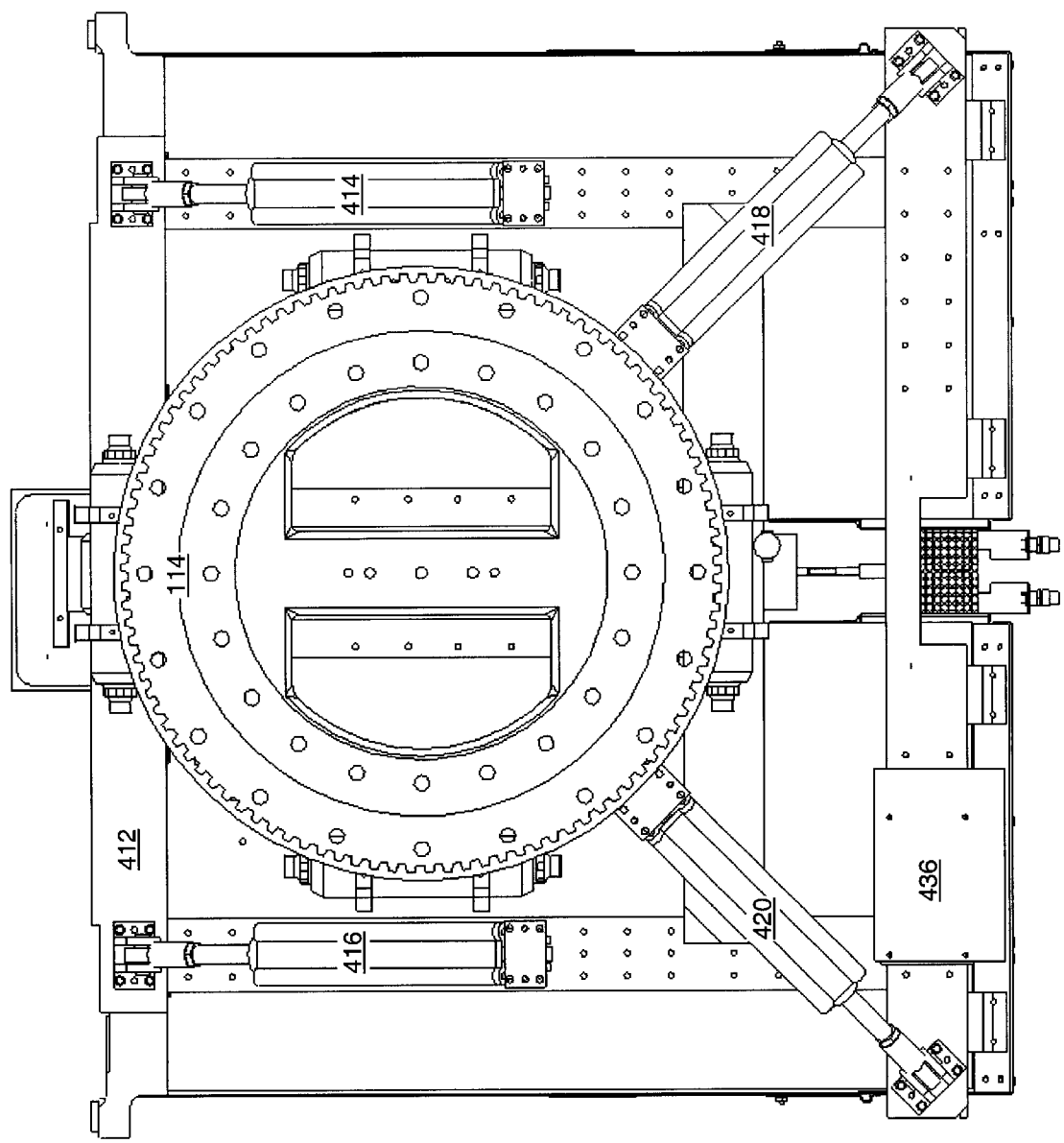
FIG. 7 is a back view of the test head actuation system of FIGS. 4–6, which shows the relative orientations of the actuators used to position the test head.
Figure 8:
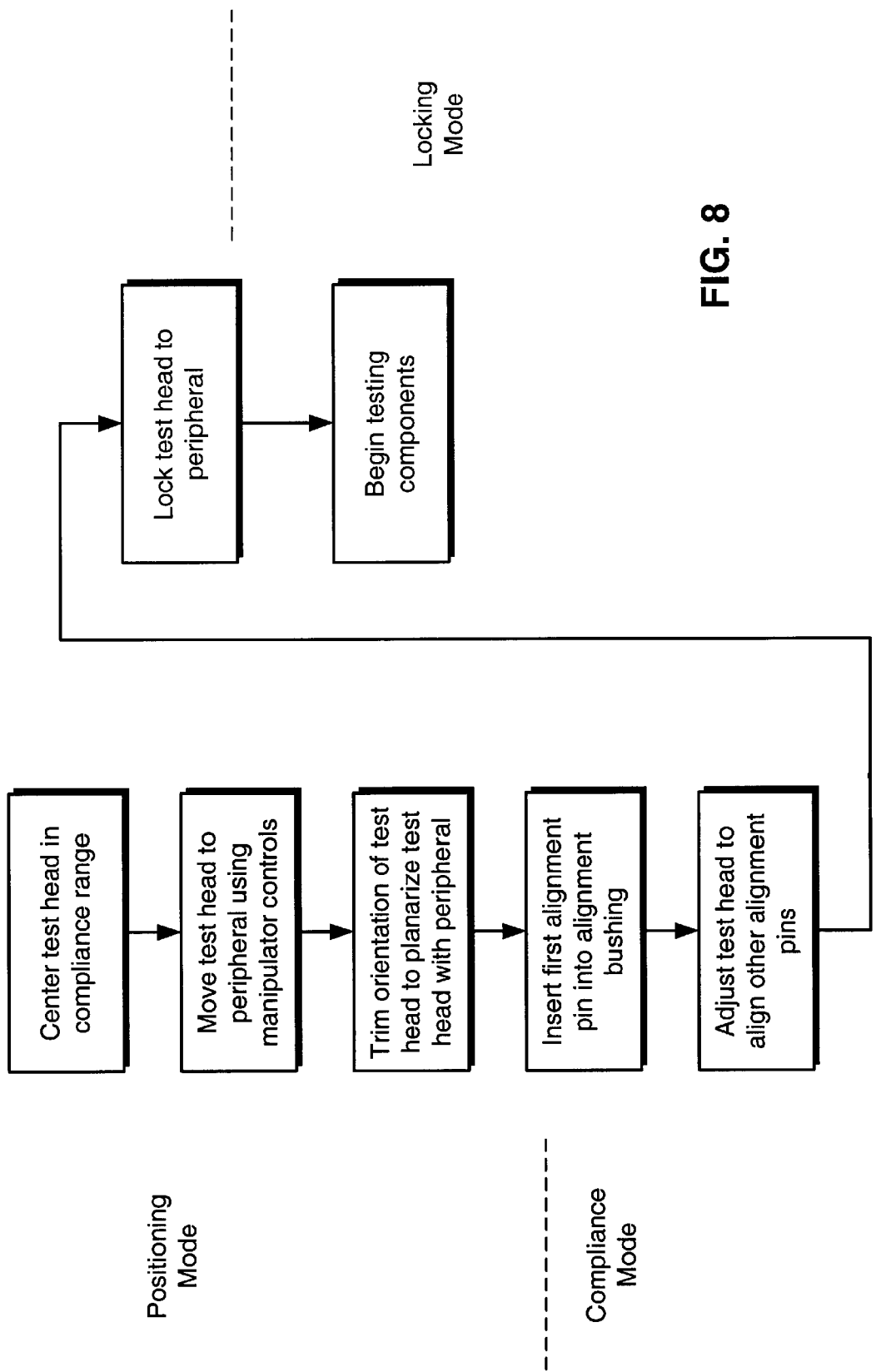
FIG. 8 is a flowchart showing steps involved in docking a test head to a peripheral according to the invention.

FIG. 7 illustrates a back view of the actuation system, i.e., from the vantage point of the manipulator. The twist support plate 410 has been omitted from the figure to provide a clearer view of the arrangement of the pneumatic cylinders 414–420. This arrangement of pneumatic cylinders 414–420 has been carefully designed to simplify control of the movement of the test head 110 relative to the manipulator 100.

In particular, first and second pneumatic cylinders 414 and 416 have longitudinal axes that are aligned substantially in parallel. Third and fourth pneumatic cylinders 418 and 420 have longitudinal axes that are aligned so that they cross each other within the perimeter of the test head 110. Ideally, the longitudinal axes of the third and fourth pneumatic cylinders cross at a point in space that precisely intersects a central axis of the test head, i.e., an axis that extends through the spherical bearing 228 at the center of the test head 110 and through the center of the twist gear 114.

This configuration of cylinders has significant properties. For example, if the first and second pneumatic cylinders 414 and 416 are actuated equally in opposite directions (one extended, the other retracted), the test head is caused to rotate in the twist direction and does not substantially rotate in the theta or tumble directions. If the third and fourth cylinders 418 and 420 are actuated by equal amounts in the same direction, the test head rotates in the tumble direction, but does not substantially rotate in the theta or twist directions. In addition, if the third and fourth cylinders are actuated by equal amounts in opposite directions, the test head is caused to rotate in the theta direction, but does not substantially rotate in the tumble or twist directions. Therefore, the configuration of actuators illustrated and described above promotes substantially independent control over the test head's movement in each of the conventional directions of theta, tumble, and twist.

Operation

The actuation system 400 preferably operates under the direction of a controller 440. The controller 440 preferably includes a hand-held console that allows an operator to specify input for moving the test head to a desired position and orientation. In response to user input, the controller 440 applies a control signal to each segment of the valve manifold 436 for controllably pressurizing the pneumatic cylinders 414–420. A sensor 442 is provided with each cylinder for measuring the extension of the shaft 424 from the body 422 of the respective cylinder. For each cylinder, the sensor 442 measures the cylinder's extension and reports the result to the controller 440. In a closed loop fashion, the controller 440 modulates the respective segment of the valve manifold 436 to controllably guide the measured extension of the cylinder reported by the sensor 442 toward the location indicated by the user input.

The controller 440 preferably includes a command for centering the cylinders within their respective compliance ranges. In response to this command, the controller 440 drives each of the cylinders 414–420 to a position that the respective sensor 442 indicates to be the center of range.

The sensor 442 can be implemented in numerous ways, the specific form of which is not critical to the invention. Pneumatic cylinders are available with built-in magnetic sensors 442 that provide electrical signals indicative of their extension. In addition, numerous forms of optical encoders can be used for measuring and reporting the extension of the cylinder. In the preferred embodiment, however, a simple "string pot" is used for measuring the extension of each cylinder. As known to those skilled in the art, a string pot is an electromechanical device that includes a spring-loaded string wrapped around a potentiometer, and generates an electrical output signal proportional to the extension of the spring. Preferably, the body of the string pot is fastened to the body 422 of the respective cylinder, and the end of the string is fastened to the respective shaft 424. Extension and retraction of the shaft 424 causes the output signal from the string pot to vary proportionally.

Operators of automatic test equipment are accustomed to controlling the position of a test head in the directions of theta, tumble, and twist. The controller 440 allows the test head 110 to be controlled in this way. In particular, the controller 440 monitors the difference between the positions of the first and second cylinders 414 and 416 to indicate a twist rotation, and forces a predetermined difference between these positions to establish a desired twist rotation. Similarly, the controller 440 monitors the difference between the positions of the second and third cylinders 418 and 420 to indicate a theta rotation, and forces a difference between them to establish a desired theta rotation. In addition, the controller 440 monitors the sum of the positions of the third and fourth cylinders 418 and 420 to indicate a tumble rotation, and forces a sum between them to establish a desired tumble rotation. In this manner, the controller 440 is able to control the rotation of the test head 110 in each of the conventional directions of theta, tumble, and twist.

We have recognized that pneumatic cylinders are not easily controlled with great precision. The difficulty in control arises primarily from the tendency of internal seals within the cylinders to stick when held in a constant position, and to quickly break free and over-extend as pressure is increased. The controller 440 accounts for this characteristic of pneumatic cylinders by permitting the feedback of the controller 440 to be satisfied as long as the extension of the cylinders falls within an allowable range of the target value. Providing an allowable range of acceptable values allows the cylinders to quickly settle close to the ideal, desired positions, without repetitively overshooting the desired position.

Operating Modes

The actuation system 400 has at least three modes of operation: (1) positioning mode; (2) compliant mode; and (3) locked mode. In positioning mode, the controller 440 continually adjusts the extensions of the pneumatic cylinders toward desired extensions, in response to user input and position feedback signals from the sensors 442. In this mode, a user can control the position and orientation of the test head, for example, from a hand-held control pod, to move the test head toward the peripheral for docking. A user can execute a command for centering the test head within its compliance range, or can adjust the orientation of the test head to account for misalignments between the test head and peripheral, caused for example by sagging of the manipulator under the substantial weight of the test head.

In compliant mode, the controller 440 causes the cylinders to hold their last updated conditions. Compliant mode is preferably established by activating the valve manifold to block the flow of air pressure to both inputs of each cylinder (i.e., the third configuration of the valve manifold 436, described above). In this mode, the cylinders tend to maintain the positions that were previously established in positioning mode. However, the closed cylinders act as air springs, allowing compliant movement either forward or backward under the influence of applied, external forces. Owing to the increased air volume supplied by the pneumatic accumulators 436, compliance of the test head is sufficiently "soft" to allow the test head to be moved with relative ease.

In locking mode, brakes are applied to the pneumatic cylinders 414–420. The cylinders cannot be positioned in this mode and they cannot be moved in compliance. The actuation system 400 preferably assumes locking mode after the test head and peripheral are docked, once the desired position of the test head is established and no further movement is desired.

The transition between positioning and compliant modes preferably occurs automatically. For example, in the preferred embodiment, a sensor 442 is included with each alignment pin to indicate when an alignment pin begins to be inserted into an alignment bushing. When the test head and peripheral are completely separated, the actuation system assumes positioning mode and remains in this mode until one of these sensors 442 is tripped. When the test head is brought to the peripheral and trips a sensor 442, the controller 440 switches the actuation system to compliant mode. In compliant mode, the operator adjusts the position of the test head to align the other alignment pins with their respective alignment bushings, and to make the test head coplanar with the peripheral. Once this occurs, docking can be completed and testing can begin.

Alternatives

Having described one embodiment, numerous alternative embodiments or variations can be made.

As described above the linear actuators 414–418 are implemented with pneumatic cylinders. This is merely an example, however. Other types of linear actuators can be used, for example, hydraulic actuators, electronic linear motors, fast rack and pinion motors, or any other type of linear, backdrivable actuator. If hydraulic cylinders are used, the system could be equipped with extendable bladders or bellows. The bladder or bellows could be blocked during positioning mode to allow for stiff movement. In compliant mode, the bladder or bellows could be pumped to match the pressure in the hydraulic cylinders, and then opened into the hydraulic cylinders. The elasticity of the bladder or bellows would provide the elasticity needed for compliant movement. If electronic motors are used, the input current to the motors could be held constant upon the transition from positioning mode to compliant mode. The electronic motors would tend to maintain their positions, and could be driven backward or forward in compliance with applied forces.

The actuation system 400 is described above in connection with a test head that is supported with an internal gimbal. However, the principles of using linear actuators in positioning and compliant modes are applicable to other types of test heads, for example, those that are supported using fork arms. Therefore, the invention should not be construed as being limited only to configurations in which a test head is supported internally.

Moreover, the invention described above could be combined with the prior art of U.S. Pat. No. 5,949,002 ("Manipulator for Automatic Test Equipment with Active Compliance"). According to this variation, the particular arrangement of actuators disclosed herein could be used to actively apply forces to the test head to balance external forces acting upon the test head, to facilitate docking.

In addition, the actuation system 400 is pictured with certain elements on the top, bottom, right, and left. It should be understood that these orientations are provided as conventions and can be varied. For example, the actuation system 400 can be turned upside down or transposed right-to-left and still operate substantially as described above. Therefore, the actuation system 400 should not be construed as being limited to any particular orientation.

Each of these alternatives and variations, as well as others, has been contemplated by the inventor and is intended to fall within the scope of the instant invention. It should be understood, therefore, that the foregoing description is by way of example, and the invention should be limited only by the spirit and scope of the appended claims.

What is claimed is:

1. A system for positioning a test head for docking with a peripheral for testing electronic devices, comprising:
    a plurality of linear actuators for moving the test head relative to a support, each of the plurality of linear actuators having a first end mechanically coupled to the test head and a second end mechanically coupled to the support; and
    a control system for controlling the positions of the plurality of linear actuators, the control system having at least two modes
        a first mode wherein the control system varies inputs to the plurality of linear actuators for establishing a desired position of the test head, and
        a second mode wherein the control system maintains substantially constant inputs to the plurality of linear actuators,
    wherein the linear actuators are movable both forward and backward in the second mode in response to external forces applied to the test head, for providing compliant movement of the test head relative to the support.

2. A system for positioning a test head as recited in claim 1, wherein the control system further assumes a third mode wherein the plurality of linear actuators are locked in position.

3. A system for positioning a test head as recited in claim 1, further comprising a sensor for each of the plurality of linear actuators, each sensor measuring a linear extension of the respective linear actuator and providing an electronic signal to the control system indicative of the linear extension.

4. A system for positioning a test head as recited in claim 3, wherein the control system forms a separate negative feedback loop with each of the plurality of linear actuators and each respective sensor, the negative feedback loop tending to drive the each linear actuator to the respective desired position.

5. A system for positioning a test head as recited in claim 1, wherein each of the plurality of linear actuators comprises a pneumatic cylinder driven by compressed air.

6. A system for positioning a test head as recited in claim 5, wherein each pneumatic cylinder has at least one pneumatic input, and further comprising a pneumatic accumulator coupled in series with the pneumatic input.

7. A system for positioning a test head as recited in claim 6, wherein the compressed air is provided to each pneumatic cylinder through a different segment of a valve manifold.

8. A system for positioning a test head as recited in claim 7, wherein each pneumatic cylinder has a first pneumatic input for which applying a positive pressure tends to drive a shaft in a forward direction and a second pneumatic input for which applying a positive pressure tends to drive the shaft in a reverse direction.

9. A system for positioning a test head as recited in claim 8, wherein each segment of the valve manifold includes:
   a first valve configuration for applying positive pressure to the first pneumatic input with respect to the second pneumatic input of the respective pneumatic cylinder;
   a second valve configuration for applying positive pressure to the second pneumatic input with respect to the first pneumatic input of the respective pneumatic cylinder; and
   a third valve configuration for interrupting a flow of pneumatic pressure to the first and second pneumatic inputs of the pneumatic cylinder.

10. A system for positioning a test head as recited in claim 1, wherein the support holds the test head from a central member that extends from a mounting plate on the support through a back surface of the test head and to a location internal to the test head, wherein the plurality of linear actuators comprises:
   a first linear actuator mechanically coupled to an upper left region of the back surface of the test head at the first end and to an upper left region of the mounting plate at the second end;
   a second linear actuator mechanically coupled to an upper right region of the back surface of the test head at the first end and to an upper right region of the mounting plate at the second end;
   a third linear actuator mechanically coupled to a lower left region of the back surface of the test head at the first end and to a lower left region of the mounting plate at the second end; and
   a fourth linear actuator mechanically coupled to a lower right region of the back surface of the test head at the first end and to a lower right region of the mounting plate at the second end,
   wherein the terms "upper," "lower," "left," and "right" are relative designations.

11. A system for positioning a test head as recited in claim 10, wherein the third and fourth linear actuators are each aligned so that longitudinal axes formed by their linear motion cross each other.

12. A system for positioning a test head as recited in claim 11, wherein the first and second linear actuators are each aligned so that longitudinal axes formed by their linear motion are substantially parallel.

13. A system for positioning a test head as recited in claim 12, wherein
   the test head has a central axis that extends from the central region of the test head and through the back surface of the test head, and
   the longitudinal axes of the third and fourth linear actuators cross the central axis of the test head.

14. A system for positioning a test head so that the test head can be docked with a peripheral for testing electronic devices, comprising:
   a mounting plate;
   a central member mechanically coupled to the mounting plate and extending through a back surface of the test head to a location internal to the test head;
   a first linear actuator mechanically coupled to an upper left region of the back surface of the test head at a first end and to an upper left region of the mounting plate at a second end;
   a second linear actuator mechanically coupled to an upper right region of the back surface of the test head at a first end and to an upper right region of the mounting plate at a second end;
   a third linear actuator mechanically coupled to a lower left region of the back surface of the test head at a first end and to a lower left region of the mounting plate at a second end; and
   a fourth linear actuator mechanically coupled to a lower right region of the back surface of the test head at a first end and to a lower right region of the mounting plate at a second end,
   wherein the terms "upper," "lower," "left," and "right" are relative designations, and
   wherein the linear actuators are operable in a first mode wherein an extension of the linear actuators is controlled and in a second mode wherein the extension of the linear actuators is not controlled, the linear actuators in the second mode changing their extension in compliance with external forces applied to the test head.

15. A system for positioning a test head as recited in claim 14, wherein the third and fourth linear actuators are each aligned so that longitudinal axes formed by their linear motion cross each other within a region formed by an outer perimeter of the test head.

16. A system for positioning a test head as recited in claim 15, wherein the first and second linear actuators are each aligned so that longitudinal axes formed by their linear motion do not cross each other within the region formed by the outer perimeter of the test head.

17. A system for positioning a test head as recited in claim 16, wherein
   the test head has a central axis that extends from the central region of the test head and through the back surface of the test head, and
   the longitudinal axes of the third and fourth linear actuators cross the central axis of the test head.

18. A system for positioning a test head as recited in claim 15, wherein the test head is moveable in a theta direction by actuating the third and fourth actuators in opposite directions.

19. A system for positioning a test head as recited in claim 18, wherein the test head is moveable in a twist direction by actuating the first and second actuators in opposite directions.

20. A system for positioning a test head as recited in claim 14, wherein the test head is moveable in a tumble direction by actuating the third and fourth actuators in a same direction.

21. A system for positioning a test head as recited in claim 14, further comprising:
   a sensor for each of the first through fourth actuators, for reporting a linear position of the respective actuator; and
   a control system, coupled to each sensor, for controlling the linear position of each actuator in response to the respective reported position.

22. A system for positioning a test head as recited in claim 21, wherein the control system is constructed and arranged to respond to differences between the reported positions of the first and second actuators, said differences being indicative of twist rotations of the test head relative to the mounting plate.

23. A method for positioning a test head so that the test head can be docked with a peripheral for testing electronic devices, comprising:

applying inputs to a plurality of linear actuators disposed between the test head and a support, for controllably varying an extension of at least one of the plurality of actuators to establish a desired position of the test head relative to the peripheral;

holding the inputs to the plurality of linear actuators constant; and with the inputs held constant, varying the extension of the at least one of the plurality of linear actuators in compliance with external forces applied to the test head.

* * * * *